United States Patent [19]

Naitoh et al.

[11] 4,305,053
[45] Dec. 8, 1981

[54] INDICATOR DRIVING DEVICE FOR TELEVISION RECEIVER INCORPORATING RADIO RECEIVER

[75] Inventors: Yasuo Naitoh, Kamakura; Nobutake Terashima, Chigasaki, both of Japan

[73] Assignee: Matsushita Electric Industrial Co., Ltd., Osaka, Japan

[21] Appl. No.: 116,813

[22] Filed: Jan. 30, 1980

[30] Foreign Application Priority Data

Feb. 6, 1979 [JP] Japan .................................. 54-12436

[51] Int. Cl.³ .............................................. H03J 1/02
[52] U.S. Cl. ..................................... 334/87; 116/252; 116/299
[58] Field of Search .................... 334/86, 87; 455/154; 116/252, 253, 299, DIG. 29, DIG. 31

[56] References Cited
U.S. PATENT DOCUMENTS 2,746,419  5/1956  Serge ................................. 334/87 X
3,812,818  5/1974  Saruwatari ........................ 334/87 X

*Primary Examiner*—Paul L. Gensler
*Attorney, Agent, or Firm*—Spencer & Kaye

[57] ABSTRACT

An improvement in the indicator driving device for use in a television receiver incorporating a radio receiver is shown. There is provided an indicator driving device of a type in which the selection of a channel for the television receiver and the selection of a frequency for the radio receiver are performed by means of a common manipulating knob. The improvement resides in a much simplified construction and facilitation of work for obtaining synchronization or matching between the frequency selecting variable capacitor of the radio receiver and the frequency indicator.

2 Claims, 11 Drawing Figures

INDICATOR DRIVING DEVICE FOR TELEVISION RECEIVER INCORPORATING RADIO RECEIVER

BACKGROUND OF THE INVENTION

The present invention relates to a frequency indicator driving device of a television receiver having an electronic tuner and incorporating a radio receiver and, more particularly, to an improvement in the indicator driving device capable of performing the selection of TV channels and the selection of radio frequencies by only one manipulating knob.

A typical conventional indicator driving device for a television receiver incorporating a radio receiver includes a TV channel selecting pulley, a radio frequency selecting pulley, two drums spaced from each other and between which is stretched a frequency indicator sheet, a drive shaft and a manipulating knob fixed to the drive shaft. The torque imparted to the drive shaft is transmitted from the latter to the above-mentioned two pulleys and two drums through wires thereby driving the indicator. Thus, the conventional indicator driving device has a complicated structure because of the use of the frequency indicator sheet which inevitably necessitates two drums. In addition, the conventional indicator driving device has a drawback in that the matching between the tuner of the radio receiver and the frequency indicator sheet is rather difficult to obtain.

SUMMARY OF THE INVENTION

It is, therefore, an object of the invention to simplify, in a television receiver having an electronic tuner and incorporating a radio receiver, the construction of the indicator driving device of the type having a single manipulating knob for selecting operations of both the radio receiver and the television receiver.

It is another object of the invention to facilitate the adjustment, synchronization or matching between the frequency selected by the radio receiver and the frequency indicated by the frequency indicator.

To these ends, according to the invention, there is provided a frequency indicator driving device for a television receiver having an electronic tuner and incorporating a radio receiver, comprising an indicator drum on the periphery of which are marked the numerals representing the codes of television broadcasting stations and the radio frequencies, the indicator drum being directly connected at its one end to the shaft of a channel selecting potentiometer of the television receiver so as to be supported by the shaft; a gear fixed to the other end of the indicator drum and meshing with an intermediate gear; an intermediate pulley fixed to the intermediate gear by means of screws; a frequency selecting pulley coupled to the shaft of a variable capacitor constituting the tuner of the radio receiver; a drive shaft to which a manipulating knob is fixed; and a driving wire wound round the intermediate pulley and the frequency selecting pulley via the drive shaft.

These and other objects, as well as advantageous features of the invention will become more clear from the following description of the preferred embodiments taken in conjunction with the accompanying drawings.

DESCRIPTION OF THE PREFERRED EMBODIMENTS

Before turning to the description of the preferred embodiments, a description will be made hereinunder as to the conventional frequency indicator driving device for a television receiver incorporating a radio receiver, in order to clarify the drawback of the prior art and, hence, the advantages of the invention.

Figure 1:
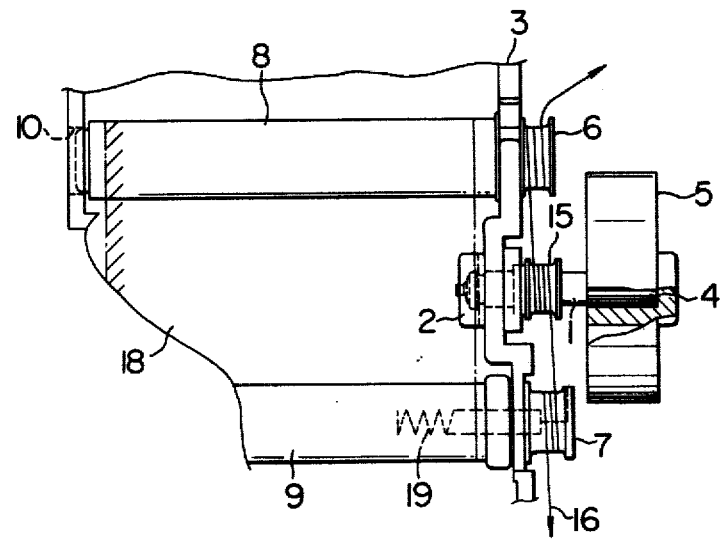
FIG. 1 is a side elevational view of a conventional indicator driving device.
Figure 2:
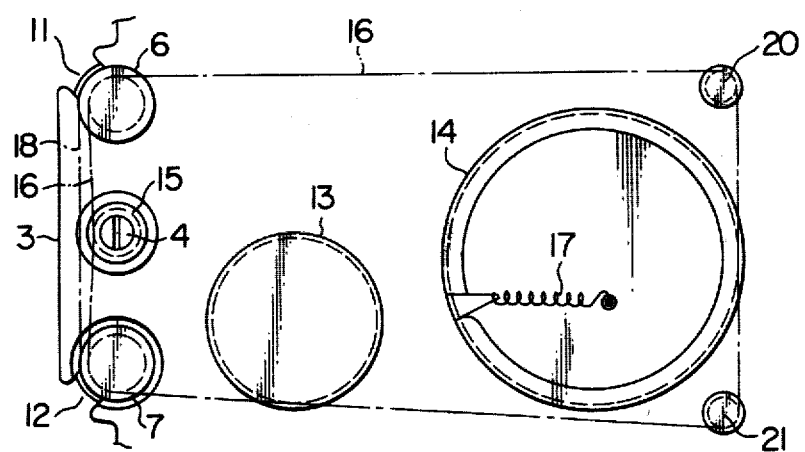
FIG. 2 is a right side elevational view of the device shown in FIG. 1.
Figure 3:
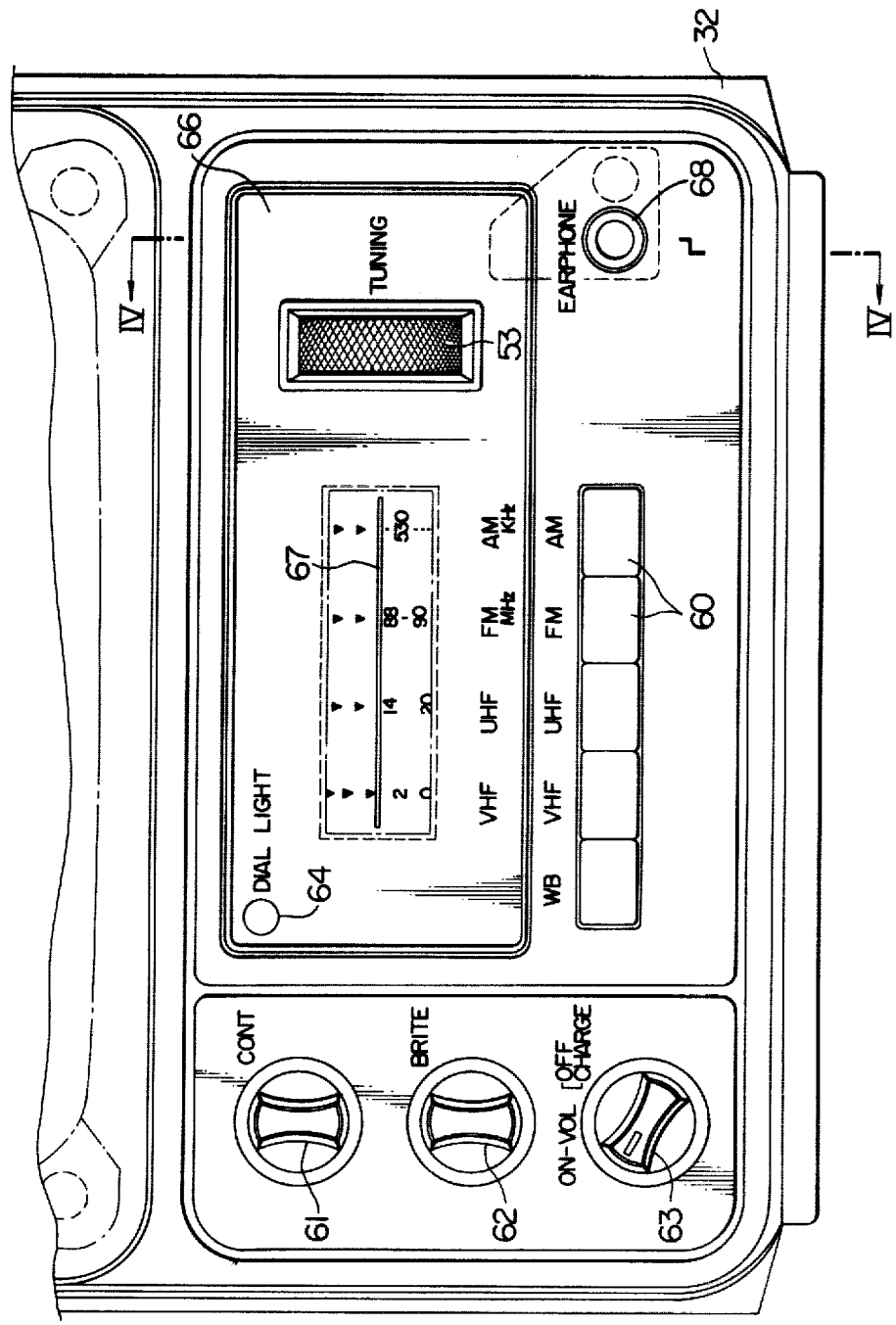
FIG. 3 is a front elevational view of an indicator driving device constructed in accordance with a first embodiment of the invention.
Figure 4:
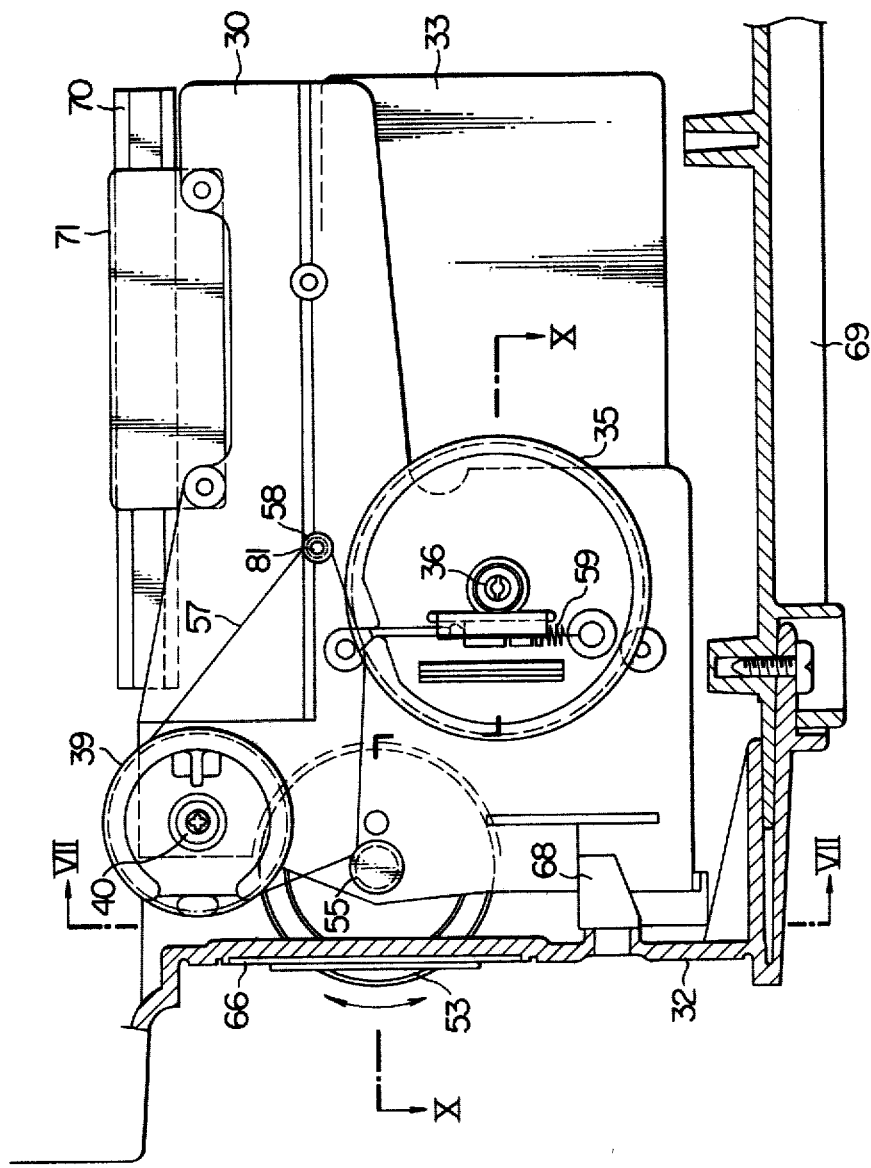
FIG. 4 is a sectional view taken along the line IV—IV of FIG. 3.

Referring first to FIGS. 1 and 2 showing a typical conventional device of the kind described, a drive shaft 1 is rotatably attached to a bracket 3 by means of a U-shaped fitting 2. The drive shaft 1 has a knurled end portion 4 which is fitted to a bore formed in a manipulating knob 5. Drums 8, 9 to one ends of which attached are pulleys 6, 7 are rotatably received at their one ends by a bore 10 and at their other ends by means of the notches 11, 12. In order to rotatably drive a channel selecting pulley 13 and a frequency selecting pulley 14, a wire 16 is wound by several turns round each of a winding drum portion 15 of the drive shaft 1, and pulleys 6, 7. The wire 16 is further wound round the channel selecting pulley 13 and the frequency selecting pulley 14. A spring 17 is provided to pull and fix the wire 16.

In the described arrangement, therefore, the pulleys 13, 14 are rotated in synchronization with each other as the manipulating knob 5 fitted to the drive shaft 1 is rotated, thereby simultaneously selecting both the television channel and the radio frequency. Further the frequency indicating sheet 18 wound round the selecting drums 8, 9 is driven thereby displaying the frequency. In FIG. 1, a reference numeral 19 denotes a spring adapted to rotatively bias the selecting drum 9 so as to impart a tension to the frequency indicating sheet 18, while reference numerals 20, 21 designate rollers.

It will be seen that this conventional indicator driving device has a complicated construction due to the use of the frequency indicating sheet which inevitably necessitates two drums.

Under these circumstances, the present invention aims at providing an indicator driving device in which the tuning operations for the radio receiver and the tuning operation for a television receiver are made through a common manipulating knob by an improved and much simplified mechanism.

A preferred embodiment of the invention will be described hereinunder with reference to FIGS. 3 to 11.

In the indicator driving device of the invention, an indicator drum, on the peripheral surface of which are marked numerals representing the frequencies is used in place of the frequency indicating sheet of the conventional frequency indicating device. The shaft of the channel selecting volume is directly connected to the frequency indicator drum. An indicator gear is unitarily attached to the frequency indicating drum. The indicator gear is arranged to mesh with an intermediate gear to which coaxially attached is an intermediate pulley. A driving wire wound round the intermediate pulley is wound round and stretched between a drive shaft and the frequency selecting pulley and is pulled and fixed by means of a spring.

Figure 5:
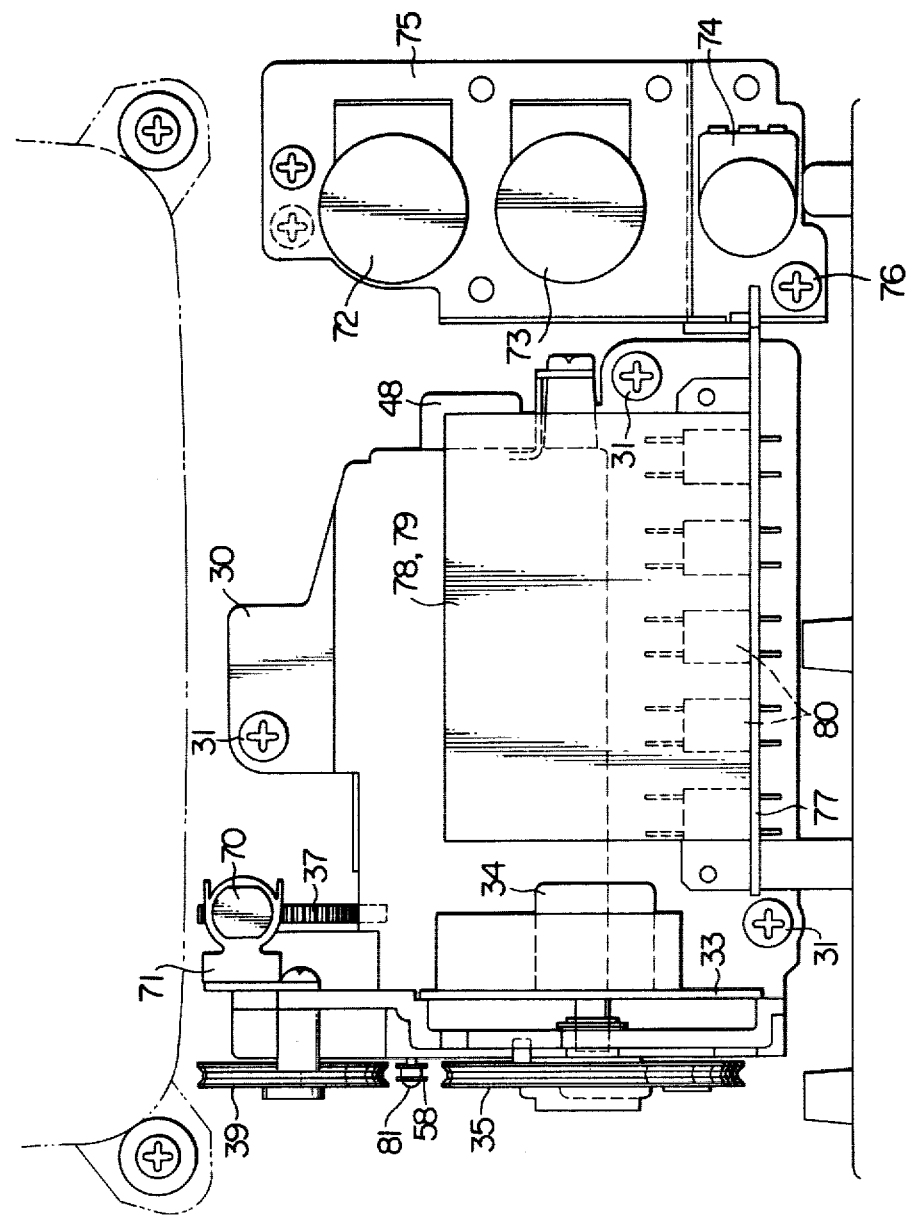
FIG. 5 is a right side elevational view of the device shown in FIG. 4.
Figure 6:
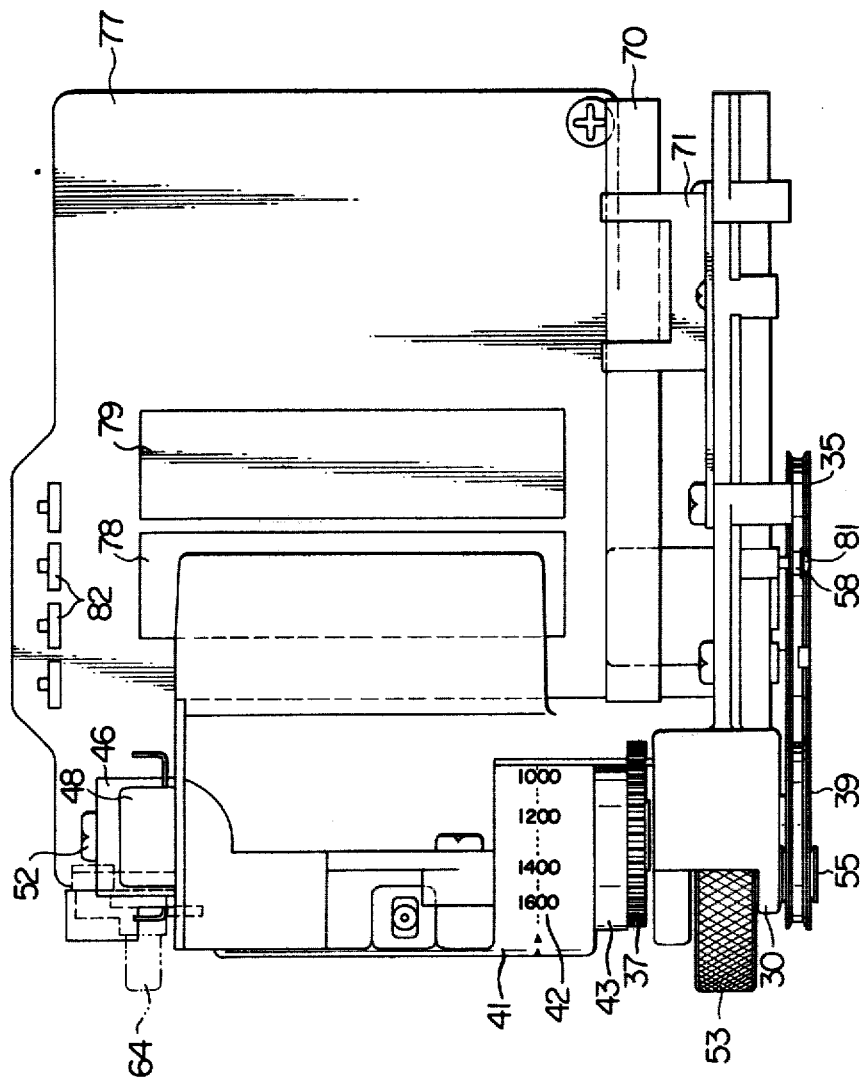
FIG. 6 is a top plan view of the device shown in FIG. 4.

Referring to the drawings, a bracket 30 is fixed by means of a plurality of screws 31 to a front cabinet 32, as will be most clearly understood from FIG. 5. A reference numeral 33 denotes a printed circuit board on which are formed the major part of the radio receiver circuit, while a variable capacitor for selecting a frequency for the radio receiver is designated at a reference numeral 34. As will be clearly seen from FIGS. 5 and 10, the variable capacitor 34 is fixed to the printed circuit board 33. A frequency selecting pulley 35 is fixed by means of a screw 36 to the rotary shaft of the frequency selecting variable capacitor 34.

Figure 8:
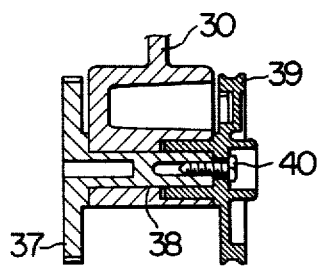
FIG. 8 is a sectional view taken along the line VIII—VIII of FIG. 7.
Figure 9:
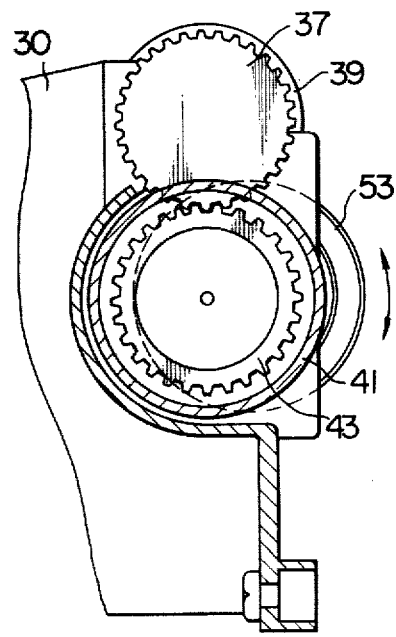
FIG. 9 is a sectional view taken along the line IX—IX of FIG. 7.

An intermediate gear 37 has, as detailed in FIG. 8, a journal portion which is rotatably received by a bore 38 formed in the bracket 30. A reference numeral 39 denotes an intermediate pulley having a cylindrical portion inserted into the bore 38 of the bracket 30 in the opposite direction to the inserting direction of the intermediate gear 37. The journal portion of the intermediate gear 37 is fitted to the inside of the cylindrical portion of the intermediate gear 37 and is fixed to the latter by means of a small screw 40, as will be clearly seen from FIG. 8.

Figure 7:
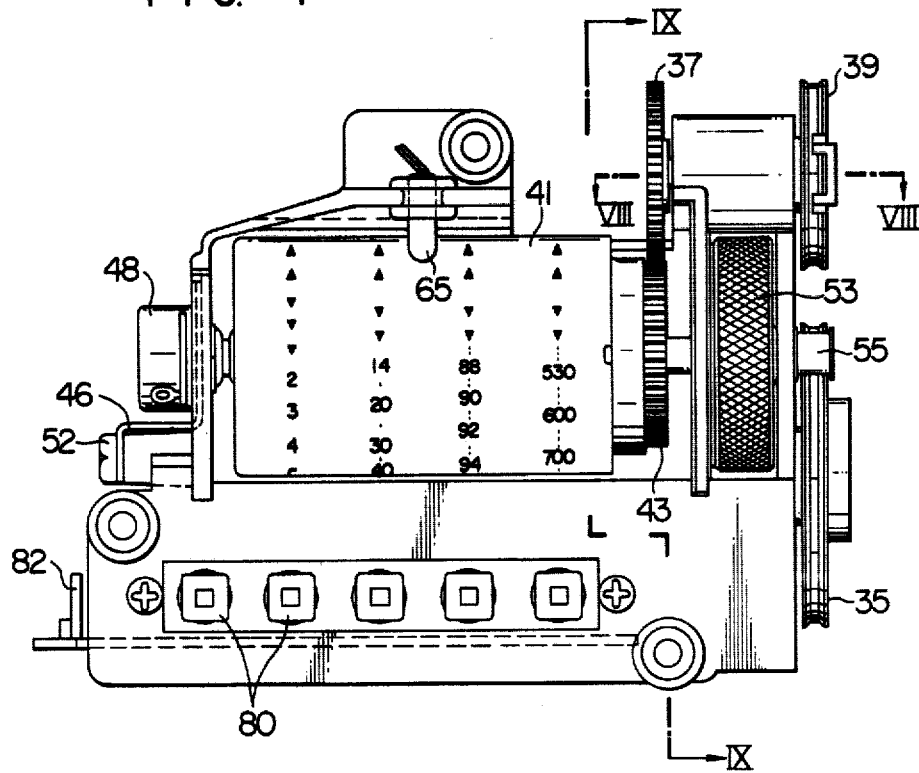
FIG. 7 is a right side elevational view of the device shown in FIG. 4.

A reference numerals 41 denotes an indicator drum on the outer peripheral surface of which are printed numerals representing the television channels and the numerals representing the radio frequencies in side-by-side relation. An indicator gear 43 is fixed to the open end of the indicator drum 41, as shown in FIG. 7.

Figure 10:
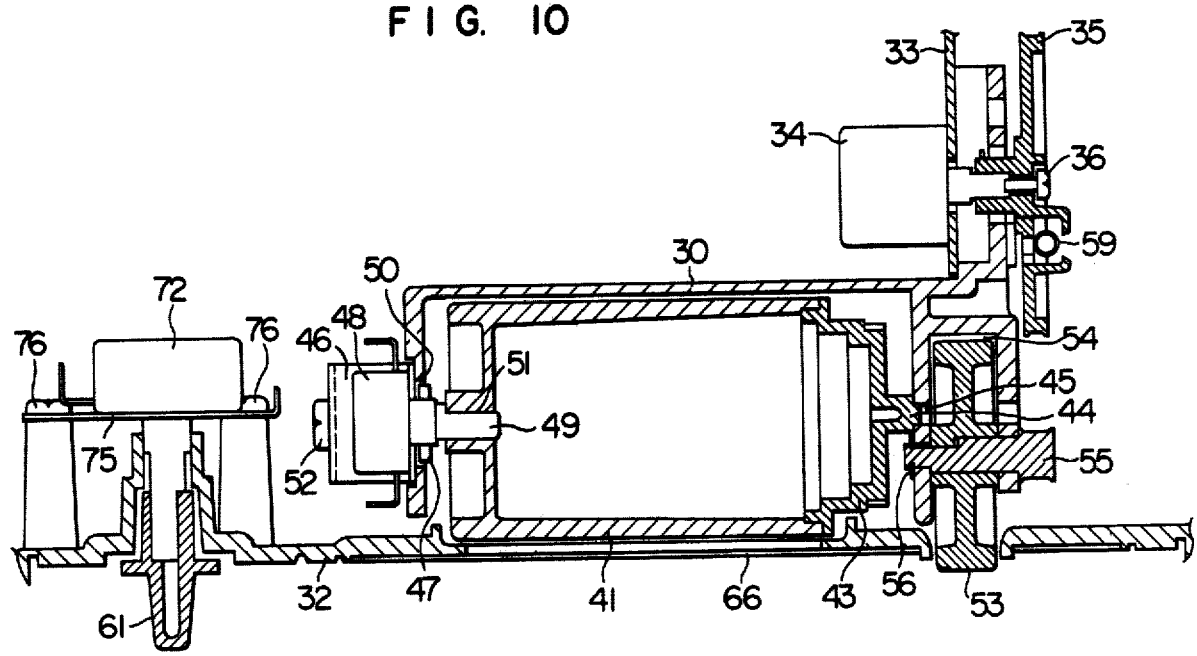
FIG. 10 is a sectional view taken along the line X—X of FIG. 4.
Figure 11:
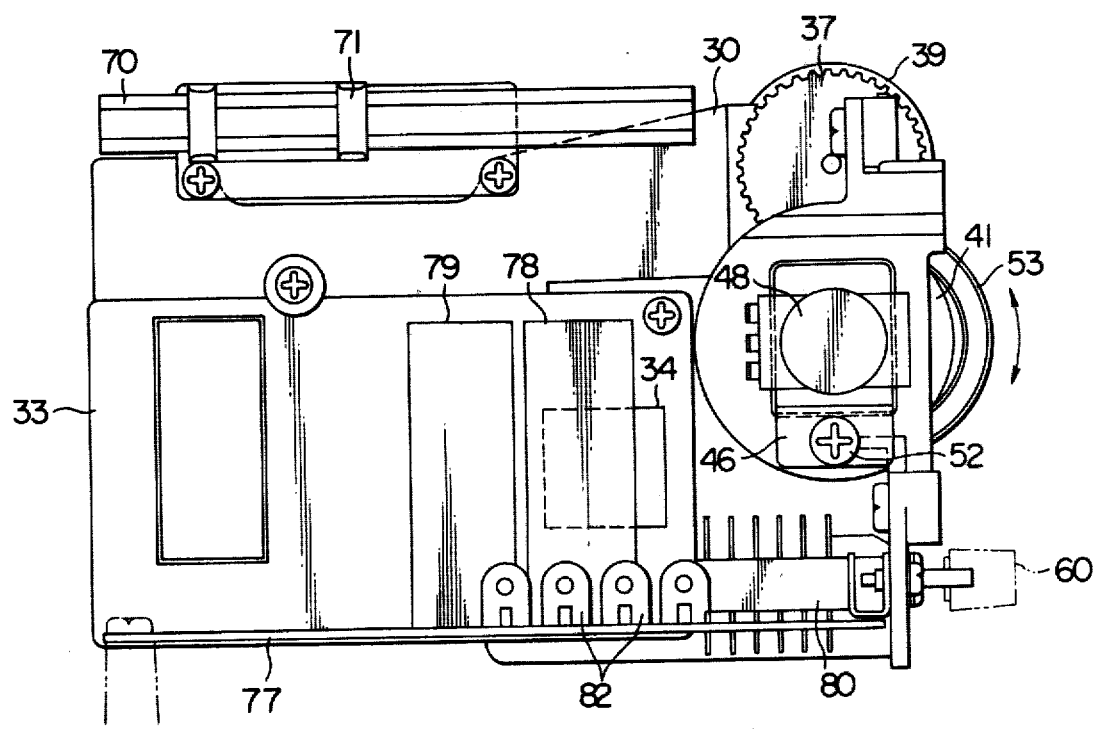
FIG. 11 is a left side elevational view of FIG. 7.

Referring now to FIG. 10 showing the detail of construction of the indicator driving device, a boss 44 formed integrally with the indicator gear 43 is rotatably received by a bore 45 formed in the bracket 30. A channel selecting potentiometer 48 is fixed to a potentiometer fixture 46 by means of a nut 47 and a washer. The potentiometer 48 has a rotary shaft 49 which extends through a bore 50 formed in the other end of the bracket 30. The rotary shaft 49 is press-fitted into a bore 51 formed in the other end of the indicator drum 41 coaxially with the boss 44. This potentiometer fixture 46 is fixed to the bracket 30 by means of a bolt 52.

Therefore, the rotary shaft 49 of the channel selecting potentiometer 48 is rotated following the rotation of the indicator drum 41. In other words, the indicator drum 41 is supported at its other end by a rotary shaft 49 of the channel selecting potentiometer 48.

In fixing the rotary shaft 49 to the indicator drum 41, it is necessary to select the angular positional relationship between these two members such that a standard channel is selected when the potentiometer 48 has been fully rotated in one direction and that the number of the selected channel on the indicator drum is aligned with the pointer or hand which will be described later.

As shown in FIG. 7, the indicator gear 43 meshes with the intermediate gear 37 when the boss 44 of the indicator gear 43 is fitted to the bore 45. A manipulating wheel 53 is received by a recess 54 formed in the bracket 30 such that a portion thereof is exposed to the outside of the front cabinet 32 as will be most clearly seen from FIG. 10. The manipulating wheel 53 is so positioned that a central bore thereof is aligned with the bore formed in the bracket 30. A drive shaft 55 has one end constituting a wire winding drum portion formed unitarily therewith and the other end which is extended through the aforementioned bore of the bracket 30 and fixedly received by the central bore of the manipulating wheel 53 so as to support the latter for unitary rotation with the drive shaft 55. A reference numeral 56 denotes an E-shaped ring or retainer fixed to the other end of the drive shaft to prevent the latter from being disengaged.

A reference numeral 57 denotes a driving wire which is wound round the wire winding drum portion of the drive shaft 55 by several turns, and then round the intermediate pulley 39. The wire runs around a roller 58 and is further wound round the frequency selecting pulley 35. The wire is then connected at its one end to one end of a spring 59 which in turn is connected at its other end to the frequency selecting pulley 35, so as to be held and tightened by the spring 59. Therefore, the pulleys 35, 39 are rotated as the driving rope 57 is moved.

A reference numeral 60 denotes change-over or selection push buttons such as for switching between the VHF and UHF channels of a television receiver, between the AM and FM bands of the radio receiver and a weather band WB for receiving weather forcasts. A reference numeral 61 denotes a contrast adjusting knob, while a brightness control knob is designated at a reference numeral 62. A knob denoted by a reference numeral 63 is provided to play the double role of power switch and a volume control knob. A reference numeral 64 denotes a push button for turning on and off a lamp 65 for illuminating the indicator drum 41. A reference numeral 66 denotes an indicator cover plate which is originally transparent and formed to correspond to the indicator drum 66. The indicator cover plate 66 is provided with a linear pointer or reference line 67. The portion of the indicator cover plate 66 other than the portion around the reference line 67 is made opaque in the finished state of the indicator cover plate 66. A reference numeral 68 denotes an earphone socket fixed to the front cabinet, while a reference numeral 69 designates a lower cabinet. Reference numerals 70 and 71 denote, respectively, a bar antenna for the radio receiver and a retainer for the bar antenna. Reference numerals 72 and 73 denote potentiometers and reference numeral 74 a combined potentiometer and switch corresponding to the aforementioned knobs 61, 62 and 63.

The potentiometer 72, 73 and the combined potentiometer and switch 74 are fixed to a second bracket 75 which is fixed to the front cabinet 32 by means of screws 76. A reference numeral 77 designates a printed circuit board constituting the circuit of the tuner for the television receiver. A VHF tuner 78 and a UHF tuner 79 for the television receiver are fixed to the printed circuit board 77.

A reference numeral 80 denotes switches corresponding to respective change-over buttons 60. A roller pin for rotatably supporting the roller 58 is designated at a reference numeral 81. Finally, a reference numeral 82 denotes a volume for fine adjustment of the tuning voltage.

In operation, assuming here that the manipulation knob 53 is rotated to select the desired channel after depression of the change-over button 60, the driving wire 57 is pulled to rotate the indicator drum 41 through the action of the intermediate pulley 39, the intermediate gear 37 and the indicator gear 43. Meanwhile, the rotary shaft 49 of the channel selecting potentiometer 48 for the television receiver is rotated to select the desired channel. Simultaneously, the number of the selected channel is indicated by cooperation of the numeral 42 marked on the indicator drum 41 and the reference line 67 of the indicator cover panel 66.

Heedless to say, the frequency selecting pulley 35 is also rotated. Thus, if the push button 60 for FM radio frequency operation has been depressed, the radio receiver operates to select the FM radio frequency through the action of the frequency selecting pulley 35 and the frequency selecting variable capacitor. It will be clear to those skilled in the art that, in this state of the radio receiver, the numerals 42 marked on the indicator drum 41 and the reference line 67 on the indicator cover cooperate with each other to indicate the received frequency.

It will be seen that the construction is greatly simplified as compared with the aforementioned conventional device. This is entirely due to the use of the indicator drum 41 to which is directly connected a channel selecting potentiometer 48. Namely, simplification of the construction has been achieved by making the indicator drum 41 take part in the power transmission and by supporting one end of the indicator drum 41 by the rotary shaft 49 of the potentiometer 48.

Hereinafter, a description will be provided to show how matching between the variable capacitor 34 of the radio receiver and the positions of numerals on the indicator drum 41 is attained.

To this end, at first the screw 40 for fixing the intermediate gear 37 to the intermediate pulley 39 is loosened to permit the intermediate gear 37 and the intermediate pulley 39 to rotate freely relative to each other. Then, the frequency selecting variable capacitor 34 is rotated fully to the minimal position, the indicator drum being rotated to make the starting point of the legend 42 coincide with the reference line 67. The screw 40 is then tightened to rigidly connect the intermediate gear 37 and the intermediate pulley 39 to each other. To make this adjustment, the screw 40 is left not tightened in the assembling process of the driving device, and the above-stated adjustment is made after stretching the driving wire 57.

As has been described, according to the invention, an indicator drum having numerals marked thereon to represent the number of channels for the television receiver and the frequencies for the radio receiver is used in place of the frequency indicating sheet employed in the conventional device. The rotary shaft of the channel selecting potentiometer is directly coupled to one end of the indicator drum to support the latter, while a gear attached to the other end of the indicator drum is made to engage an intermediate gear to which is fixed an intermediate pulley. Further, a frequency selecting pulley is coupled to the rotary shaft of the frequency selecting variable capacitor. The driving wire is wound round the drum portion of the drive shaft to which the manipulating knob is fixed, and is also wound round the intermediate pulley and the frequency selecting pulley.

This arrangement offers two advantages: a highly simplified construction of the indicator driving device and a facilitation of the work for obtaining matching between the variable capacitor of the radio receiver and the indicator drum.

What is claimed is:

1. An indicator driving device for a television receiver incorporating a radio receiver, comprising: an indicator drum rotatably supported at one end by a bracket, said indicator drum having a plurality of numerals printed on its outer peripheral surface and representing the numbers of channels for said television receiver and the frequencies for said radio receiver; a channel selecting potentiometer attached to said bracket and having a rotary shaft directly coupled to the other end of said indicator drum thereby supporting said indicator drum; a manipulating knob rotatably mounted on said bracket and carried by a drive shaft one end of which constitutes a wire winding drum portion; a frequency selecting pulley connected to the rotary shaft of the frequency selecting means of said radio receiver; an intermediate gear meshing with a gear formed on one end of said indicator drum; an intermediate pulley connected to said intermediate gear and rotatably supported by said bracket; a driving wire wound round said wire winding drum portion of said drive shaft, said intermediate pulley and said frequency selecting pulley; and means associated with said frequency selecting pulley for imparting tension to said driving wire.

2. An indicator driving device as claimed in claim 1, characterized in that said intermediate gear and said intermediate pulley are rigidly connected to each other by means of at least one screw, said screw being adapted, when loosened, to permit said intermediate gear and said intermediate drum to rotate freely and independently of each other.

* * * * *